United States Patent
Trefonas, III et al.

(10) Patent No.: US 7,026,101 B2
(45) Date of Patent: Apr. 11, 2006

(54) ANTIREFLECTIVE COATING COMPOSITIONS

(75) Inventors: Peter Trefonas, III, Medway, MA (US); Manuel doCanto, Stoughton, MA (US); Edward K. Pavelchek, Stow, MA (US)

(73) Assignee: Shipley Company, LLC, Marlborough, MA (US)

( * ) Notice: Subject to any disclaimer, the term of this patent is extended or adjusted under 35 U.S.C. 154(b) by 0 days.

(21) Appl. No.: 09/918,399

(22) Filed: Jul. 30, 2001

(65) Prior Publication Data

US 2002/0031729 A1   Mar. 14, 2002

Related U.S. Application Data

(60) Provisional application No. 60/222,140, filed on Jul. 31, 2000.

(51) Int. Cl.
*G03F 7/00* (2006.01)
(52) U.S. Cl. ............................ 430/322; 430/950
(58) Field of Classification Search ............. 430/270.1, 430/290, 311, 313, 322, 950, 330
See application file for complete search history.

(56) References Cited

U.S. PATENT DOCUMENTS

| | | | | |
|---|---|---|---|---|
| 5,554,489 A | * | 9/1996 | Ishibashi et al. ............. 430/326 |
| 5,853,471 A | * | 12/1998 | Yoshida et al. ......... 106/287.13 |
| 5,882,835 A | * | 3/1999 | Park et al. ................... 430/170 |
| 5,886,102 A | * | 3/1999 | Sinta et al. .................. 525/154 |
| 5,935,760 A | | 8/1999 | Shao et al. ............... 430/271.1 |
| 5,939,236 A | | 8/1999 | Pavelchek et al. ........ 430/273.1 |
| 5,985,512 A | * | 11/1999 | Hatakeyama et al. .... 430/270.1 |
| 6,040,053 A | * | 3/2000 | Scholz et al. ............... 428/412 |
| 6,156,479 A | | 12/2000 | Meador et al. .......... 430/270.1 |
| 6,190,839 B1 | | 2/2001 | Pavelchek et al. .......... 430/325 |
| 6,261,743 B1 | | 7/2001 | Pavelchek et al. .......... 430/325 |
| 6,316,165 B1 | | 11/2001 | Pavelchek et al. .......... 430/311 |
| 6,323,310 B1 | | 11/2001 | Puligadda et al. .......... 528/423 |
| 6,329,117 B1 | * | 12/2001 | Padmanaban et al. ... 430/270.1 |
| 6,410,209 B1 | | 6/2002 | Adams et al. .............. 430/311 |
| 6,451,503 B1 | | 9/2002 | Thackeray et al. ...... 430/271.1 |
| 6,456,148 B1 | * | 9/2002 | Patti et al. ................ 430/270.1 |
| 6,465,148 B1 | * | 10/2002 | Kang et al. ............... 430/270.1 |
| 6,472,128 B1 | | 10/2002 | Thackeray et al. ......... 430/322 |
| 6,503,689 B1 | | 1/2003 | Zampini et al. ......... 430/270.1 |
| 6,528,235 B1 | | 3/2003 | Thackeray et al. ...... 430/271.1 |
| 2002/0022196 A1 | | 2/2002 | Pavelchek et al. .......... 430/311 |

FOREIGN PATENT DOCUMENTS

| | | |
|---|---|---|
| EP | 0 813 114 A2 | 12/1997 |
| EP | 0 942 331 A1 | 9/1999 |
| EP | 0 987 600 A1 | 3/2000 |
| JP | 10-301268 * | 11/1998 |

OTHER PUBLICATIONS

Database WPI; Section Ch, Week 199717; Derwent Publications Ltd., London, GB; AN 1997-189534; XP002181699 & JP 09 050130 A (Sumitomo Chem Co. Ltd.), Feb. 18, 1997—Abstract.

* cited by examiner

*Primary Examiner*—Nicole Barreca
(74) *Attorney, Agent, or Firm*—Peter F. Corless; Edwards Angell Palmer & Dodge LLP

(57) ABSTRACT

Antireflective compositions are provided that contain a basic additive material. Such use of a basic material can significantly decrease or even completely eliminate notching of an overcoated photoresist relief image. Antireflective formulations of the invention are preferably crosslinking compositions and may contain a resin component in addition to the basic additive. Antireflective compositions of the invention can be effectively used at a variety of wavelengths used to expose an overcoated photoresist layer, including 248 nm and 193 nm.

35 Claims, No Drawings

ANTIREFLECTIVE COATING COMPOSITIONS

This application claims the benefit of U.S. Provisional Application(s) No(s).: 60/222,140 filing date Jul. 31, 2000.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions that contain a basic additive component that can reduce undesired footing or notching of an overcoated photoresist relief image.

2. Background

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions in general are known to the art and described by Deforest *Photoresist Materials and Processes,* McGraw Hill Book Company, New York, ch. 2, 1975 and by Moreau, *Semiconductor Lithography, Principles, Practices and Materials,* Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See, for example, PCT Application WO 90/03598, EPO Application No. 0 639 941 A1 and U.S. Pat. Nos. 4,910,122, 4,370,405, 4,362,809, and 5,939,236. Such layers have also been referred to as antireflective layers or antireflective compositions. See also U.S. Pat. Nos. 5,939,236; 5,886,102; 5,851,738; and 5,851,730, all assigned to the Shipley Company, which disclose highly useful antireflective compositions.

We have found that use of some prior antireflective compositions can induce undesired undercutting (notching) of an overcoated, developed resist relief image. Another problem induced by at least some prior antireflective compositions has been "footing", i.e. failure to clear all exposed photoresist during development that results in an upwardly tapering relief image sidewall. Both notching and footing can compromise resolution of the image patterned into the underlying substrate.

It thus would be desirable to have new antireflective coating compositions. It would be particularly desirable to have new antireflective coating compositions that do not induce undesired notching in an overcoated resist relief image.

SUMMARY OF THE INVENTION

We have now found new antireflective compositions that can provide surprisingly enhanced performance results, particularly reduced or elimination of notching of an overcoated resist relief image.

More specifically, we have surprisingly found that addition of a basic material to an antireflective composition can significantly decrease or even completely eliminate notching of an overcoated photoresist relief image. See, for instance, the results of the Examples and Comparative Examples which follow.

A variety of basic materials may be employed in antireflective compositions of the invention. In general, basic materials used in antireflective compositions of the invention will have a pKa of about 2 or 3 or greater, more typically about 4 or 5 or greater, even more typically about 6, 7, 8, or 9 or greater. The basic additive also suitably may be a strong base, e.g. a pKa of about 10, 11, 12, 13 or greater. Compounds that contain a hetero atom (N, O or S) are generally preferred basic additives. For example, hydroxy compounds, ethers, sulfides, and amines will be suitable, with amines being generally preferred. Higher molecular weight materials are particularly preferred, e.g. a molecular weight in excess of about 150 or 200, more preferably about 300, 400 or 500 or greater. Oligomeric or polymeric amines are particularly preferred.

Without being bound by theory, we believe that photogenerated acid of an overcoated resist layer will congregate at the resist/antireflective composition interface. We further believe that such acid concentration at the resist bottom regions can result because the photogenerated acid can diffuse more readily through the resist/antireflective coating layers interface than through the bulk resist material. That acid concentration can result in significant photoacid diffusion into adjacent, unexposed resist layer areas, which upon resist layer development will result in undesired notching of the resist relief image. We have found that such notching is particularly problematic with chemically-amplified positive photoresists that can undergo a photo-induced deblocking reaction under relatively mild conditions, e.g. positive resists that contain a resin with deblocking acetal or ketal groups.

Antireflective coating compositions of the invention suitably will contain a resin component in addition to the basic additive. Alternatively, an oligomeric or polymeric base additive may be the sole resin component of an antireflective composition. It is generally preferred however that an antireflective composition contain at least one resin component, e.g. to impart good film-forming properties to the antireflective composition.

Antireflective compositions of the invention also will contain a component that comprises chromophore groups that can absorb undesired reflections of radiation used to expose the overcoated resist layer. Generally preferred chromophores are aromatic groups, including both single ring and multiple ring aromatic groups such as optionally substituted phenyl, optionally substituted naphthyl, optionally substituted anthracene, optionally substituted phenanthracenyl, optionally substituted quinolinyl, and the like. Particularly preferred chromophores may vary with the radiation employed to expose an overcoated resist layer. More specifically, for exposure of an overcoated resist at 248 mn, optionally substituted anthracene is a particularly preferred chromophore of the antireflective composition. For exposure of an overcoated resist at 193 nm, optionally substituted phenyl is a particularly preferred chromophore of the antireflective composition. Preferably, such chromophore groups are linked (e.g. pendant groups) to a resin component of the antireflective composition, either a polymeric base additive component or an additional resin component distinct from the polymeric base additive.

Preferred antireflective coating compositions of the invention can be crosslinked, e.g. by thermal and/or radiation treatment. For example, preferred antireflective coating compositions of the invention may contain a separate crosslinker component that can crosslink with one or more other components of the antireflective composition. Generally preferred crosslinking antireflective compositions comprise a separate crosslinker component such as an amine-based material, e.g. a glycoluril, benzoguanamine or melamine resin. Particularly preferred antireflective compositions of the invention contain as separate components, a resin, a crosslinker, and a basic additive. Additionally, crosslinking antireflective compositions of the invention preferably also contain an acid or acid generator compound particularly a thermal acid generator) to induce or promote crosslinking of one or more composition components. Crosslinking antireflective compositions are preferably crosslinked prior to application of a photoresist layer over the antireflective layer. Thermal-induced crosslinking of the antireflective composition is generally preferred.

Antireflective compositions of the invention are preferably used in combination with positive-acting chemically amplified photoresist compositions. As demonstrated in the Examples which follow, antireflective compositions of the invention can reduce or eliminate undesired notching even with acetal-based or ketal-based chemically amplified positive photoresists, which are particularly prone to undesired notching, as discussed above. Antireflective compositions of the invention are also suitably used with negative-acting photoresists as well as other types of positive resists.

The invention further provides methods for forming a photoresist relief image and novel articles of manufacture comprising substrates (such as a microelectronic wafer substrate) coated with an antireflective composition of the invention alone or in combination with a photoresist composition. Other aspects of the invention are disclosed infra.

DETAILED DESCRIPTION OF THE INVENTION

As discussed above, a basic additive of an antireflective composition of the invention preferably will have a pKa of about 2 or 3 or greater, more typically about 4 or 5 or greater, even more typically a pKa about 6, 7, 8, or 9 or greater. Strongly basic additives also will be suitable, e.g. a pKa of about 10, 11, 12, or 13 or greater. All references herein to pKa values are to values determined in water at 25° C.

Preferred basic additives contain electron-rich moieties, such as groups that contain a nitrogen, sulfur and/or oxygen atom, preferably at least one nitrogen atom. A basic additive may be aromatic or non-aromatic. Preferred basic additives contain one or more hydroxy groups; ether groups; sulfide groups; and/or amine groups. Optionally substituted amine groups are generally preferred. An amine-containing basic additive may contain one more primary, secondary, tertiary and/or quaternary amine groups. Quaternary amines may be suitably present in salt form.

Substituents of substituted amines groups of basic additives of the invention include e.g. hydroxy; optionally substituted alkyl e.g. alkyl having from 1 to about 16 carbon atoms, more typically alkyl having from 1 to about 8 carbon atoms; optionally substituted alkenyl e.g. alkenyl having from 2 to about 16 carbon atoms, more typically alkenyl having from 2 to about 8 carbon atoms; optionally substituted alkynyl e.g. alkynyl having from 2 to about 16 carbon atoms, more typically alkynyl having from 2 to about 8 carbon atoms; optionally substituted alkoxy e.g. having from 1 to about 16 carbon atoms, more typically 1 to about 8 carbon atoms; optionally substituted carbocyclic aryl e.g. optionally substituted phenyl, optionally substituted naphthyl, optionally substituted anthracene and the like; optionally substituted aralkyl such as aralkyl having from 7 to about 20 carbon atoms e.g. optionally substituted benzyl and the like; and optionally substituted heteroaromatic or heteroalicyclic groups preferably having 1 to 3 rings, 3 to 8 ring members in each ring and from 1 to 3 hetero atoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, and pyrrolindinyl; etc.

Other basic additives, such as hydroxy compounds, ethers, sulfides and the like, may be suitably by the same or similar substituents. For example, hydroxy-containing basic additives may suitably contain one or more hydroxy groups, typically one to about three or four hydroxy groups, as substituents of alkyl e.g. having 1 to about 16 carbon atoms; alkenyl e.g. having 2 to about 16 carbon atoms; alkynyl e.g. having 2 to about 16 carbon atoms; carbocyclic aryl such as phenyl, naphthyl or anthracene; heteroalicyclic or heteroaromatic having 1 to about 3 separate or fused rings and 1–3 hetero (N, O or S) atoms per ring such as those heterocyclic groups mentioned above. Polymeric hydroxy base additives typically will have one to about four hydroxy groups per hydroxy-containing repeat unit.

Ether base additives may comprise one or more, typically one to about three or four alkoxy groups e.g. having 1 to about 16 carbons. Those alkoxy groups may be substituents of other groups such as specified above for hydroxy-containing base additives. A variety of polymeric ether materials may be employed as base additives in antireflective compositions of the invention.

Sulfide base additives may comprise one or more, typically one to about three or four alkylthio groups e.g. having 1 to about 16 carbon atoms. Those alkylthio groups may be substituents of other groups such as specified above for hydroxy-containing base additives. Polymeric thio compounds also may be employed as base additives in antireflective compositions of the invention.

As also discussed above, preferred base additive compounds of the invention have a relatively high molecular weight. Such higher molecular weight materials will be less prone to volatilization during any thermal curing of an antireflective coating layer that contains the base additive.

Preferred higher molecular base additives have a molecular weight of at least about 100, 150, 200, 250, 300, 350, 400, 450, 500, 600, 700, 800, 900, 1000 daltons. Even higher molecular weight additives also will be preferred such as basic additives having a molecular weight of at least about 1200, 1400, 1600, 1800, 2000, 2200, 2400, 2600, 2800, 3000, 3500, 4000, 4500, 5000, 6000, 7000, 8000, 9000, 10000, 15000, 20000, or 30000 daltons. For polymeric materials, molecular weight references herein are to Mw.

Oligomeric and polymeric basic additives are generally preferred. Particularly preferred are oligomeric and polymeric materials having amine substitution either integral to the polymer backbone or as pendant moieties. Such polymeric amine functionalities suitably may be primary, secondary, tertiary and/or quaternary amines.

Suitable oligomeric or polymeric basic additives of antireflective compositions of the invention can be formed by polymerization of two or more distinct monomers. Such monomers may be characterized as a base or "basic" if the monomer contributes to the basic nature of the polymer, or as a non-base if the monomer does not contribute to the basic nature of the polymer. Based on that nomenclature, preferred copolymer base additives comprise from about 1 to 50 mole percent basic monomers, more preferably from about 2 to about 20 mole percent basic monomers, still more preferably from about 5 to about 10 mole percent basic monomers.

A variety of polymeric materials may be employed as a base additive, provided the polymer comprises one or more basic moieties as discussed above. For example, a polymeric basic additive may comprise polymerized aromatic groups such as phenolic units (such as provided by polymerization of vinylphenol), or phenyl units optionally substituted by other than hydroxy (such as provided by polymerization of optionally substituted styrene or α-methylstyrene); acrylate or methacrylate units such as alkyl acrylate or alkyl methacrylate e.g. $C_{1-6}$alkyl acrylates and methylates including methyl acrylate, methyl methacrylate, ethyl acrylate, ethyl methacrylate, butyl acrylate, butyl methacrylate, etc.; cyano units such as may be provided by polymerization of acrylonitrile or methacrylonitrile; alicyclic units, including alicyclic units that are integral to the polymer backbone as well as pendant alicyclic units e.g. adamantyl acrylate adamantyl methacrylate, optionally substituted norbornene, etc.; and the like.

Preferred polymeric base additives include Si atoms, more preferably siloxane (Si—O) groups. Particularly preferred are aminopolysiloxanes. Especially preferred repeat units include dialkylsiloxane units such as di($C_{1-12}$alkyl) siloxane units, particularly di-($C_{1-6}$alkyl)siloxane, especially dimethylsiloxane; and alkylsiloxane units substituted with one or more basic functionalities, particularly aminoalkylsiloxane units such as $C_{1-16}$alkylsiloxane units having one or more primary, secondary or tertiary amine groups, with (aminoethylaminopropyl)methylsiloxane being particularly preferred. Also preferred are copolymers that contain dialkylsiloxane units that are unsubstituted with amine groups. Also preferred are copolymer basic additives that comprise repeat units of dialkylsiloxane units (preferably dimethylsiloxane units) and aminoalkylsiloxane units (preferably (aminopropyl)methylsiloxane units). Particularly preferred polymeric base additives includes those having a structure corresponding to Formulae (I) and (II) below, where the designation m and n indicates the mole fraction of the specified units in the polymer. Suitably such basic additive polymers of Formulae (I) and (II) have an Mw of about 500 to 50,000, more typically from about 1,000 or 2,000 to 50,000. A variety of such polymers are commercially available from Gelest, Inc.

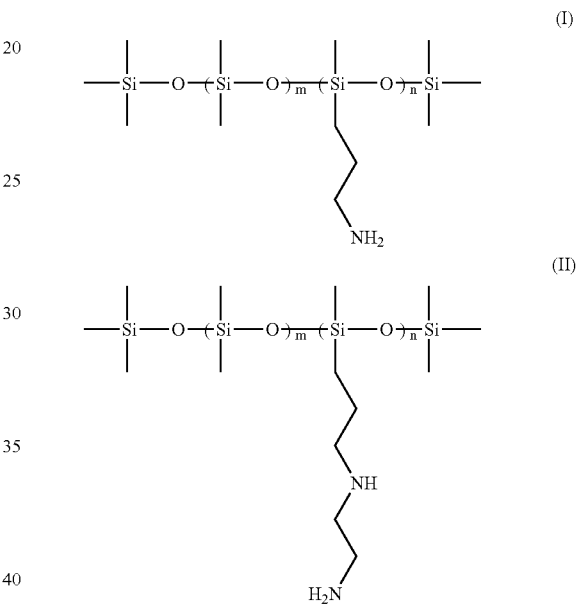

As discussed above, lower molecular weight base additives also can be suitably employed in antireflective compositions of the invention, including non-polymeric base additives. For example, suitable base additives include those having a molecular weight of less than about 600 daltons, more typically less than about 500, 400, 300, 200, 150 or 100 daltons. A base additive typically will have a molecular weight of at least about 40, 50, 60, 70, 80, 90, 100 or 125 daltons.

Preferred lower molecular weight basic additives, which may be non-polymeric, include substituted amines, including primary, secondary, tertiary and quaternary amines that may be substituted with e.g. groups specified above, i.e. hydroxy; optionally substituted alkyl; optionally substituted alkenyl; optionally alkynyl; optionally substituted alkoxy; optionally substituted carbocyclic aryl; optionally substituted aralkyl; and optionally substituted heteroaromatic or heteroalicyclic groups; etc.

Primary, secondary, tertiary or quaternary aliphatic amines are particularly preferred. For example, base additives of antireflective compositions of the invention include those of the formula $(R^1)(R^2)R^3N$, where $R^1$, $R^2$, and $R^3$ are independently hydrogen or an optionally substituted alkyl group such as optionally substituted $C_{1-16}$alkyl, with at least one of $R^1$, $R^2$, and $R^3$ being other than hydrogen.

Lower molecular weight base additives, which may be non-polymeric materials, also suitably may be other than amines, such as compounds having hydroxy, ether or sulfide moieties, as discussed above.

One or more basic additives may be suitably present in a relatively wide range of amounts in an antireflective composition of the invention. Suitably one or more base additives are employed in an amount sufficient to inhibit or substantially prevent undesired notching of an overcoated photoresist layer. Suitable amounts of the polymeric base can vary rather widely and can be readily determined empirically. Typical formulations may contain the polymeric base at concentrations ranging from about 0.01 to about 10 percent of total solids, more typically from about 0.05 to about 2 percent of total solids. As used herein, the term "total solids" of an antireflective composition refers to all components of the composition except solvent carrier.

Optimal amounts of a base additive that is employed in an antireflective composition also may vary with the characteristics of the base additive. More particularly, if the base additive is a strong base, e.g. a pKa of 9 or 10 or greater, or more typically a pKa of 11, 12 or 13 or greater, relatively smaller amount of the base additive may be suitably employed in an antireflective composition to achieve effective results. Similarly, if the base additive can exhibit surfactant-like properties and concentrate at upper regions of an antireflective composition coating layer, relatively smaller amounts of the base additive may be suitably employed in the antireflective composition. A base additive may exhibit such surfactant-type properties if the additive has one or more extended alkyl groups, e.g. one or more alkyl groups containing 6 or more carbons.

Antireflective compositions of the invention also may comprise one or more photoacid generators (i.e. "PAGs") that are suitably employed in an amount sufficient to inhibit or substantially prevent undesired notching of an overcoated photoresist layer. Such use of photoacid generators in antireflective compositions has been disclosed in commonly assigned U.S. Pat. No. 5,939,236. In this use of photoacid generators, the photoacid generator is not used as an acid source for promoting a crosslinking reaction, and thus preferably the photoacid generator is not substantially activated during crosslinking of the antireflective composition (in the case of a crosslinking ARC). In particular, with respect to antireflective compositions that are thermally crosslinked, the antireflective composition PAG should be substantially stable to conditions of the crosslinking reaction so that the PAG can be activated and generate acid during subsequent exposure of an overcoated resist layer. Specifically, preferred PAGs for such use in antireflective composition do not substantially decompose or otherwise degrade upon exposure of temperatures of from 140 or 150 to 190° C. for 5 to 30 or more minutes.

Generally preferred photoacid generators for such use in ARCs of the invention include e.g. onium salts such as di(4-tert-butylphenyl)iodonium perfluorooctane sulfonate, halogenated non-ionic photoacid generators such as 1,1-bis[p-chlorophenyl]2,2,2-trichloroethane, and other photoacid generator disclosed herein for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

In preferred aspects of the invention, an antireflective composition comprises both a base additive material and a photoacid generator.

A photoacid generator may be suitably employed in an antireflective composition in a relatively wide range of amounts. Preferred amount of a photoacid generator are exemplified by the compositions of the examples which follow. Suitable amounts are also disclosed in U.S. Pat. No. 5,939,236.

As discussed above, antireflective composition may suitably contain a resin component in addition to the base additive material. Suitable resin components may contain chromophore units for absorbing undesired reflections of radiation used to image an overcoated resist layer.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophores, e.g. groups having from two to three of four fused or separate rings with 3 to 8 ring members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4–5 of European Published Application 813114A2 of the Shipley Company.

For imaging at 193 nm, the ARC composition preferably may contain a resin that has phenyl chromophore units. For instance, one suitable ARC resin for use with photoresists imaged at 193 nm is a terpolymer consisting of polymerized units of styrene, 2-hydroxyethylmethacrylate and methylmethacrylate (30:38:32 mole ratio). Such phenyl resins and use of same in Arc compositions have been disclosed in U.S. application Ser. No. 09/153,575, filed 1998 and corresponding European Published Application EP87600A1, assigned to the Shipley Company.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While antireflective composition resin binders having such absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the antireflective compositions of the invention may vary within relatively broad ranges, and in general the resin binder is employed in a concentration of from about 50 to 95 weight percent of the total of the dry components of the antireflective composition, more typically from about 60 to 90 weight percent of the total dry components (all components except solvent carrier).

Crosslinking-type antireflective compositions of the invention also contain a crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as melamine materials, including melamine resins such as manufactured by American Cyanamid and sold under the tradename of Cymel 300, 301, 303, 350, 370, 380, 1116 and 1130. Glycolurils are particularly preferred including glycolurils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65 and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Low basicity antireflective composition crosslinkers are particularly preferred such as a methoxy methylated glycoluril. A specifically preferred crosslinker is a methoxy methylated glycoluril corresponding to the following structure and is referred to as Powderlink 1174 in the examples which follow:

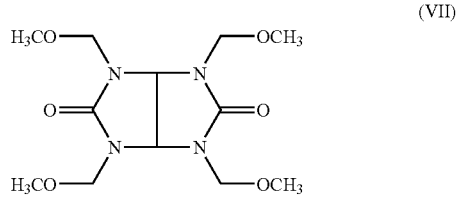

(VII)

This methoxy methylated glycoluril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$ hydroxyalkyl substituents. Phenol compounds are generally preferred such as di-methanolphenol ($C_6H_3$ ($CH_2OH$)$_2$ OH) and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a low basicity crosslinker such as a methoxy methylated glycoluril used in antireflective compositions of the invention can provide excellent lithographic performance properties, including significant reduction (SEM examination) of undercutting or footing of an overcoated photoresist relief image.

A crosslinker component of antireflective compositions of the invention in general is present in an amount of between 5 and 50 weight percent of total solids (all components except solvent carrier) of the antireflective composition, more typically in an amount of about 7 to 25 weight percent total solids.

Crosslinking antireflective compositions of the invention preferably further comprise an acid or thermal acid generator compound for catalyzing or promoting crosslinking during curing of an antireflective composition coating layer. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Typically a thermal acid generator is present in an antireflective composition in concentration of from about 0.1 to 10 percent by weight of the total of the dry components of the composition, more preferably about 2 percent by weight of the total dry components.

Also, as discussed above, rather than a thermal acid generator, an acid may be simply formulated into the antireflective composition, particularly for antireflective compositions that require heating to cure in the presence of acid so that the acid does not promote undesired reaction of composition components prior to use of the antireflective composition. Suitable acids include e.g. strong acids such as sulfonic acids such as toluene sulfonic acid and sulfonic acid, triflic acid, or mixtures of those materials.

The present invention also includes antireflective compositions that do not undergo significant cross-linking during intended use with a photoresist composition. Such non-crosslinking antireflective compositions include a photoacid generator as disclosed herein, but need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or a thermal acid generator.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with antireflective compositions of the invention are chemically-amplified resists, particularly positive-acting chemically-amplified resists compositions, where the photoactivated acid in the resist layer induces a deprotection-type reaction of one or more composition components to thereby provide solubility differentials between exposed and unexposed regions of the resist coating layer.

A number of chemically-amplified resist compositions have been described, e.g., in U.S. Pat. Nos. 4,968,581; 4,883,740; 4,810,613; 4,491,628 and 5,492,793, all of which are incorporated herein by reference for their teaching of maling and using chemically amplified positive-acting resists. A particularly preferred chemically amplified photoresist for use with an antireflective composition of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

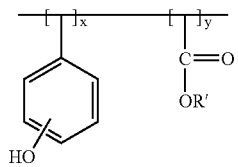

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbonyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.

As discussed above, antireflective compositions also are suitably used with positive chemically-amplified photoresists that have acetal groups that undergo deblocking in the presence of photoacid. Such acetal-based resists have been described in e.g. U.S. Pat. Nos. 5,929,176 and 6,090,526.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Preferred negative-acting resist compositions for use with an antireflective composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with antireflective compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonate esters and sulfonyloxy ketones. See J. of Photopolymer Science and Technology, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al. The above camphorsulfonate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

Antireflective compositions of the invention that include a low basicity crosslinker such as a suitable glycoluril are particularly useful with photoresists that generate a strong acid photoproduct upon exposure such as triflic acid, camphor sulfonate or other sulfonic acid, or other acid having a pKa (25° C.) of about 2 or less. Without wishing to be bound by theory, it is believed that antireflective compositions of the invention are particularly effective with such strong acid resists because the strong photogenerated acid will migrate from the resist and remain in the antireflective composition layer to a lesser extent relative to a comparable antireflective composition that contains a more basic crosslinker. That is, the low basicity crosslinkers of the invention will tie up strong photogenerated acids of an overcoated resist layer to a lesser extent than a more basic antireflective composition crosslinker. As a result, less acid loss from the resist layer will occur and resolution problems such as footing will be even further reduced.

Various substituents and materials (including basic materials, resins, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$alkylamino; carbocyclic aryl such as phenyl, naphthyl, anthracenyl, etc; and the like.

In use, an antireflective composition of the invention is applied as a coating layer to a substrate by any of a variety of methods such as spin coating. The antireflective composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, ceramic, quartz or copper substrates may also be employed. Substrates used for liquid crystal display or other flat panel display applications are also suitably employed, for example glass substrates, indium tin oxide coated substrates and the like. Substrates for optical and optical-electronic devices (e.g. waveguides) also can employed.

Preferably the antireflective layer is cured before a photoresist composition is applied over the antireflective composition. Cure conditions will vary with the components of the antireflective composition. Thus, if the composition does not contain an acid or thermal acid generator, cure temperatures and conditions will be more vigorous than those of a composition containing an acid or acid generator compound. Typical cure conditions are from about 120° C. to 225° C. for about 0.5 to 40 minutes. Cure conditions preferably render the antireflective composition coating layer substantially insoluble to the photoresist solvent as well as an alkaline aqueous developer solution.

After such curing a photoresist is applied over the surface of the antireflective composition. As with application of the antireflective composition, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the antireflective composition layer and photoresist layer should occur.

The resist layer is then imaged with activating radiation through a mask in conventional manner. The exposure energy is sufficient to effectively activate the photoactive component of the resist system to produce a patterned image in the resist coating layer as well as activate the photoacid generator of at least a portion of the thickness of antireflective composition layer so that photogenerated acid from the PAG of the antireflective composition is present at the antireflective composition/resist coating layers interface. Typically, the exposure energy typically ranges from about 3 to 300 mJ/cm$^2$ and depending in part upon the exposure tool and the particular resist and resist processing that is employed The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antihalation coating layer.

All documents mentioned herein are incorporated herein by reference. The following non-limiting examples are illustrative of the invention.

EXAMPLE 1

Preparation of Preferred Antireflective Composition Resin Binders

Hydroxyethyl methacrylate (HEMA)/methylanthracene methacrylate (ANTMA) copolymer was prepared as follows.

A 300 ml 3N round bottom flask equipped with magnetic stirrer, condenser, nitrogen and vacuum inlet was charged with 16.0 g (0.1229 mol) HEMA (purified by distillation), 8.49 g (0.0307 mol) methylanthracene methacrylate, 0.2449 g (1 wt. %) AIBN and 180 ml THF. The reaction flask was quenched in liquid nitrogen while being purged with nitrogen. When the contents of the reaction flask were frozen, the flask was evacuated, then purged with nitrogen (3 times). The reaction mixture was stirred under reflux for 18 hours. The pale yellow polymer was precipitated into 3000 ml ether, filtered, then dried at 50° C. under vacuum (yield 86%) to provide the HEMA/ANTMA copolymer having 81 mole percent of —$CH_2$ $C(CH_3)(CO_2CH_2CH_2OH)$— units and 19 mole percent of —$CH_2C(CH_3)(CO_2CH_2$-9-anthracene) units, a Mn of 2295, Mw of 19150 and a Tg of 101° C.

EXAMPLE 2

Preparation of an Antireflective Material which Contains a Polymeric Base.

An antireflective composition was prepared by placing into a container, and dissolving:
- 0.807 g of the polymer of Example 1
- 0.101 g of Powderlink 1174 crosslinker (American Cyanamid)
- 0.00460 g of p-toluene sulfonic acid
- 0.008 g of AMS-162 (copolymer of 93:7 dimethyl silicone: aminopropyl methyl silicone, obtained from Gelest Corporation)
- 39.08 g of propylene glycol monomethyl ether The solution was then filtered through a filter with a 0.2 micron pores into a clean bottle.

EXAMPLE 3

Preparation of an Antireflective Material Containing a Polymeric Base and a Photoacid Generator.

An antireflective composition was prepared by placing into a container, and dissolving:
- 0.807 g of the polymer of Example 1
- 0.101 g of Powderlink 1174 crosslinker (American Cyanamid)
- 0.00276 g of p-toluene sulfonic acid
- 0.00920 g of AMS-162 (copolymer of 93:7 dimethyl silicone:aminopropyl methyl silicone, Gelest Corporation)
- 0.00580 g of bis(2,4-dimethylphenyl) diazo methane disulfone, product name DAM-105 (Midori Corp, Japan)
- 39.08 g of propylene glycol monomethyl ether The solution was then filtered through a filter with a 0.2 micron pores into a clean bottle.

EXAMPLE 4

Preparation of an Antireflective Material which Contains a Polymeric Base, a Lower Molecular Weight Base and a Photoacid Generator.

An antireflective composition was prepared by placing into a container, and dissolving:
- 49.77 g of the polymer of Example 1
- 6.27 g of Powderlink 1174 crosslinker (American Cyanamid)
- 0.171 g of p-toluene sulfonic acid
- 0.456 g of AMS-162 (copolymer of 93:7 dimethyl silicone: aminopropyl methyl silicone, Gelest Corporation)
- 0.285 g of bis(2,4-dimethylphenyl) diazo methane disulfone, product name DAM-105 (Midori Corp, Japan)
- 0.0470 g of triethylamine
- 2443 g of propylene glycol monomethyl ether The solution was then filtered through a filter with a 0.2 micron pores into a clean bottle.

COMPARATIVE EXAMPLE 1

Preparation of an Antireflective Material which Contains No Base Additive Component.

An antireflective composition was prepared by placing into a container, and dissolving:
- 97.9 g of a 12.75% solution of the polymer of Example 1 in a 1:1 ethyl lactate:propylene glycol ether acetate solvent
- 1.56 g of Powderlink 1174 crosslinker (American Cyanamid)
- 0.04332 g of p-toluene sulfonic acid
- 0.0708 g of bis-(tert-butyl phenyl) camphor sulfonate
- 85.42 g of a 1:1 ethyl lactate:propylene glycol methyl ether acetate solvent The solution was then filtered through a filter with a 0.2 micron pores into a clean bottle.

COMPARATIVE EXAMPLE 2

Preparation of an Antireflective Material Which Contains a Non-Basic Additive.

An antireflective composition was prepared by placing into a container, and dissolving:
- 38.52 g of the polymer of Example 1
- 12 g of the condensation product of resorcinol and bis-methylol-p-cresol (92% of which is bis-(rescorcinol-methylene) p-cresol)
- 9.00 g of Powderlink 1174 crosslinker (American Cyanamid)
- 0.300 g of bis-(tert-butyl phenyl) camphor sulfonate
- 0.180 g of p-toluene sulfonic acid
- 940 g of a 5:3:2 propylene glycol methyl ether acetate: 1-ethoxy-2-propanol: anisole solvent blend The solution was then filtered through a filter with a 0.2 micron pores into a clean bottle.

COMPARATIVE EXAMPLE 3

Preparation of an Antireflective Material which Contains a Non-Basic Additive and a Non-Basic Surfactant.

An antireflective composition was prepared by placing into a container, and dissolving:
- 12.64 g of the polymer of Example 1

3.06 g of the condensation product of resorcinol and bis-methylol-p-cresol (92% of which is bis-(rescorcinol-methylene) p-cresol)
2.16 g of Powderlink 1174 crosslinker (American Cyanamid)
0.09 g of bis-(tert-butyl phenyl) camphor sulfonate
0.101 g of FC 430 surfactant (3M Company)
0.0540 g of p-toluene sulfonic acid
214 g of propylene glycol methyl ether acetate
70.03 g of 2-methylbutanol The solution was then filtered through a filter with a 0.2 micron pores into a clean bottle

COMPARATIVE EXAMPLE 4

Preparation of an Antireflective Material Which Contains a Non-Basic Polymeric Additive and a Non-Basic Surfactant.

An antireflective composition was prepared by placing into a container, and dissolving:
5.813 g of the polymer of Example 1
0.155 g of Powderlink 1174 crosslinker (American Cyanamid)
0.00250 g of FC 430 surfactant (3M Company)
0.0345 g of FC520 (3M corporation) . . . acid catalyst
0.363 g of polyhydroxystyrene) (Maruzen Corporation)
83.31 g of propylene glycol methyl ether acetate
49.98 g of 1-ethoxy-2-propanol
33.326 g of anisole The solution was then filtered through a filter with a 0.2 micron pores into a clean bottle.

COMPARATIVE EXAMPLE 6

An Anti-Reflective Composition was Prepared by Placing into a Container, and Dissolving:
59.82 g of the polymer of Example 1
8.97 g of Powderlink 1174 crosslinker (American Cyanamid)
0.300 g of p-toluene sulfonic acid
2930 g of propylene glycol monomethyl ether The solution was then filtered through a filter with a 0.2 micron pores into a clean bottle.

TEST PROCEDURE AND RESULTS

Two different types of photoresists were tested with the above antireflective compositions of the comparative examples.

The first resist, referred to herein as Resist 1, contained a photoacid generator and a resin that contained phenolic units and photoacid deblocking t-butyl(meth)acrylate units.

The second photoresist, referred to herein as Resist 2, contained a photoacid generator compound and a resin that contained acetal-type photoacid deblocking groups.

Multiple silicon wafers were spin coated with each of antireflective compositions of the above Examples and Comparative using a TEL MARK 8 automated wafer track. The replicate antireflective films were then baked on a proximity hotplate over the range of temperatures stated in Table I. Spin speeds were selected to give a film thickness of about 60 nm following the bake. Resists 1 and 2 were then coated on the antireflective film, baked, exposed on an ASM deep-UV wafer stepper, given a post-exposure bake, and then developed in 0.26 N tetramethyl ammonium hydroxide developer using a 60 second spray-puddle process. Resist 1 was given a 130° C./60 second prebake and a 130° C./90 second post-exposure bake. Resist 2 was given a 90° C./60 sec prebake and a 110° C./90 second post-exposure bake.

TABLE I

Antireflective film bake conditions

| Antireflective Composition | Resist 1 Bake Range | Resist 2 Bake Range |
|---|---|---|
| Example 2 | 130–180° C. | 150–200° C. |
| Example 3 | 130–160° C. | 150–175° C. |
| Example 4 | 130–160° C. | 150–175° C. |
| Comp. Example 1 | 150–225° C. | 160–225° C. |
| Comp. Example 2 | 150–225° C. | 160–225° C. |
| Comp. Example 3 | 150–225° C. | 160–225° C. |
| Comp. Example 4 | 170–200° C. | 160–200° C. |
| Comp. Example 5 | 150–225° C. | 160–200° C. |

With respect to the results set forth in Table I, profile shapes with Examples 3 and 4 varied significantly as a function of antireflective film bake temperatures. The optimal antireflective film bake conditions for Examples 3 and 4 were 145° C. when used with Resist 1, and 150° C. when used with Resist 2.

The resulting profiles were then examined using high-voltage cross-section scanning electron microscopy. Resist exposure dose and focus was adjusted to yield the best possible profile shape (as close to vertical sidewalls with a flat resist top as possible), while maintaining a resist linewidth which was approximately equal to the masking linewidth (following reduction).

TABLE II

Results, with profile shapes:

| Antireflective Comp. | Resist 1 Relief Image Profile | Resist 2 Relief Image Profile |
|---|---|---|
| Example 2 | slightly footed | good |
| Example 3 | good | good |
| Example 4 | good | good |
| Comp. Example 1 | good | undercut |
| Comp. Example 2 | good | undercut |
| Comp. Example 3 | good | undercut |
| Comp. Example 4 | good | undercut |
| Comp. Example 5 | good | undercut |

With respect to the results set forth in Table II, a "good" profile refers to a profile in which the resist feature is largely free of flaring, footing or undercut at the antireflective film-resist interface. A "footed" profile refers to a flaring or presence of protuberances from the bottom of the resist feature, at the antireflective film-resist interface. An "undercut" profile refers to the presence of a notch or narrowing of the resist feature at the antireflective film-resist interface.

The foregoing description of the invention is merely illustrative thereof, and it is understood that variations and modifications can be made without departing from the spirit of scope of the invention as set forth in the following claims.

What is claimed is:

1. A coated substrate comprising:
    an antireflective composition layer comprising as separate components (i) a basic material, (ii) a crosslinker, (iii) an acid or acid generator compound, and (iv) a resin, and
    a photoresist layer over the antireflective composition layer, the photoresist comprising a resin that comprises photoacid-labile acetal or ketal groups.

2. The substrate of claim 1 wherein the basic material has a pKa of about 3 or greater.

3. The substrate of claim 1 wherein the basic material has a pKa of about 6 or greater.

4. The substrate of claim 1 wherein the basic material has a pKa of about 9 or greater.

5. The substrate of claim 1 wherein the basic material contains one or more N, O or S atoms.

6. The substrate of claim 1 wherein the basic material contains one or more amine groups.

7. The substrate of claim 1 wherein the basic material contains one or more hydroxy, ether, or sulfide groups.

8. The substrate of claim 1 wherein the basic material has a molecular weight of less than about 500.

9. The substrate of claim 1 wherein the basic material is a polymeric material.

10. The substrate of claim 1 wherein the antireflective composition is crosslinked.

11. The substrate of claim 1 wherein the antireflective composition comprises a thermal acid generator and a photoacid generator compound.

12. The substrate of claim 1 wherein the antireflective layer comprises a resin distinct from a polymeric basic material.

13. The substrate of claim 1 wherein the antireflective layer comprises aromatic groups.

14. The substrate of claim 1 wherein the antireflective layer comprises anthracenyl, naphthylene or phenyl groups.

15. The substrate of claim 1 wherein comprises the antireflective composition a thermal acid generator compound.

16. A method for forming a photoresist relief image, comprising:
    applying an antireflective composition on a substrate, the antireflective composition comprising as separate components (i) a basic material, (ii) a crosslinker, (iii) an acid or acid generator compound, and (iv) a resin,
    applying a photoresist layer over the antireflective composition layer, the photoresist comprising a resin that comprises photoacid-labile acetal or ketal groups; and
    exposing and developing the photoresist layer to provide a resist relief image.

17. The method of claim 16 wherein the antireflective layer is crosslinked prior to application of the photoresist layer.

18. The method of claim 16 wherein the antireflective layer is thermally cured prior to application of the photoresist layer.

19. The method of claim 16 wherein the basic material has a pKa of about 3 or greater.

20. The method of claim 16 wherein the basic material has a pKa of about 6 or greater.

21. The method of claim 16 wherein the basic material has a pKa of about 9 or greater.

22. The method of claim 16 wherein the basic material contains one or more N, O or S atoms.

23. The method of claim 16 wherein the basic material contains one or more amine groups.

24. The method of claim 16 wherein the basic material contains one or more hydroxy, ether, or sulfide groups.

25. The method of claim 16 wherein the basic material has a molecular weight of less than about 500.

26. The method of claim 16 wherein the basic material is a polymeric material.

27. The method of claim 16 wherein the antireflective composition comprises a thermal acid generator and a photoacid generator compound.

28. The method of claim 16 wherein the antireflective layer comprises a resin distinct from a polymeric basic material.

29. The method of claim 16 wherein the antireflective layer comprises aromatic groups.

30. The method of claim 16 wherein the photoresist layer is exposed with patterned radiation having a wavelength of about 260 nm or less.

31. The method of claim 16 wherein the photoresist layer is exposed with patterned radiation having a wavelength of about 248 nm, 193 nm or 157 nm.

32. The method of claim 16 wherein the photoresist layer is exposed with radiation having a wavelength of about 248 nm and the antireflective layer comprises anthracenyl or naphthylene groups.

33. The method of claim 16 wherein the photoresist layer is exposed with radiation having a wavelength of about 193 nm and the antireflective layer comprises phenyl group.

34. The method of claim 16 wherein the photoresist layer is exposed with patterned radiation having a wavelength of about 193 nm.

35. The method of claim 16 wherein the antireflective composition comprises a thermal acid generator compound.

\* \* \* \* \*